(12) United States Patent
Habets et al.

(10) Patent No.: US 8,440,475 B2
(45) Date of Patent: May 14, 2013

(54) ALIGNMENT CALCULATION

(75) Inventors: Boris Habets, Dresden (DE); Michiel Kupers, Dresden (DE); Wolfgang Henke, Radebeul (DE)

(73) Assignee: Qimonda AG, Munich (DE)

( * ) Notice: Subject to any disclaimer, the term of this patent is extended or adjusted under 35 U.S.C. 154(b) by 1321 days.

(21) Appl. No.: 12/184,798

(22) Filed: Aug. 1, 2008

(65) Prior Publication Data

US 2010/0030360 A1 Feb. 4, 2010

(51) Int. Cl.
*G01R 31/26* (2006.01)
*H01L 21/66* (2006.01)

(52) U.S. Cl.
USPC ............. 438/16; 438/14; 438/17; 438/18; 324/500; 700/117; 700/120; 700/121

(58) Field of Classification Search .................. None
See application file for complete search history.

(56) References Cited

U.S. PATENT DOCUMENTS

| | | | |
|---|---|---|---|
| 6,068,954 A * | 5/2000 | David | 430/22 |
| 6,327,513 B1 * | 12/2001 | Ziger | 700/121 |
| 6,766,211 B1 * | 7/2004 | Ausschnitt | 700/117 |
| 7,069,104 B2 * | 6/2006 | Suzuki et al. | 700/121 |
| 7,229,566 B2 * | 6/2007 | Matsumoto et al. | 216/60 |
| 2004/0082085 A1 * | 4/2004 | Rossiger et al. | 438/16 |
| 2005/0154484 A1 * | 7/2005 | Lee et al. | 700/121 |
| 2007/0021860 A1 * | 1/2007 | Gertrudus Simons et al. | 700/121 |
| 2008/0182344 A1 * | 7/2008 | Mueller et al. | 438/5 |

* cited by examiner

*Primary Examiner* — Zandra Smith
*Assistant Examiner* — Khanh Duong
(74) *Attorney, Agent, or Firm* — Cozen O'Connor

(57) ABSTRACT

Alignment data from an exposure tool suitable for exposing a plurality of semiconductor wafers are provided, the alignment data including alignment values applied by the exposure tool to respective ones of the plurality of semiconductor wafers at a plurality of measured positions.

15 Claims, 3 Drawing Sheets

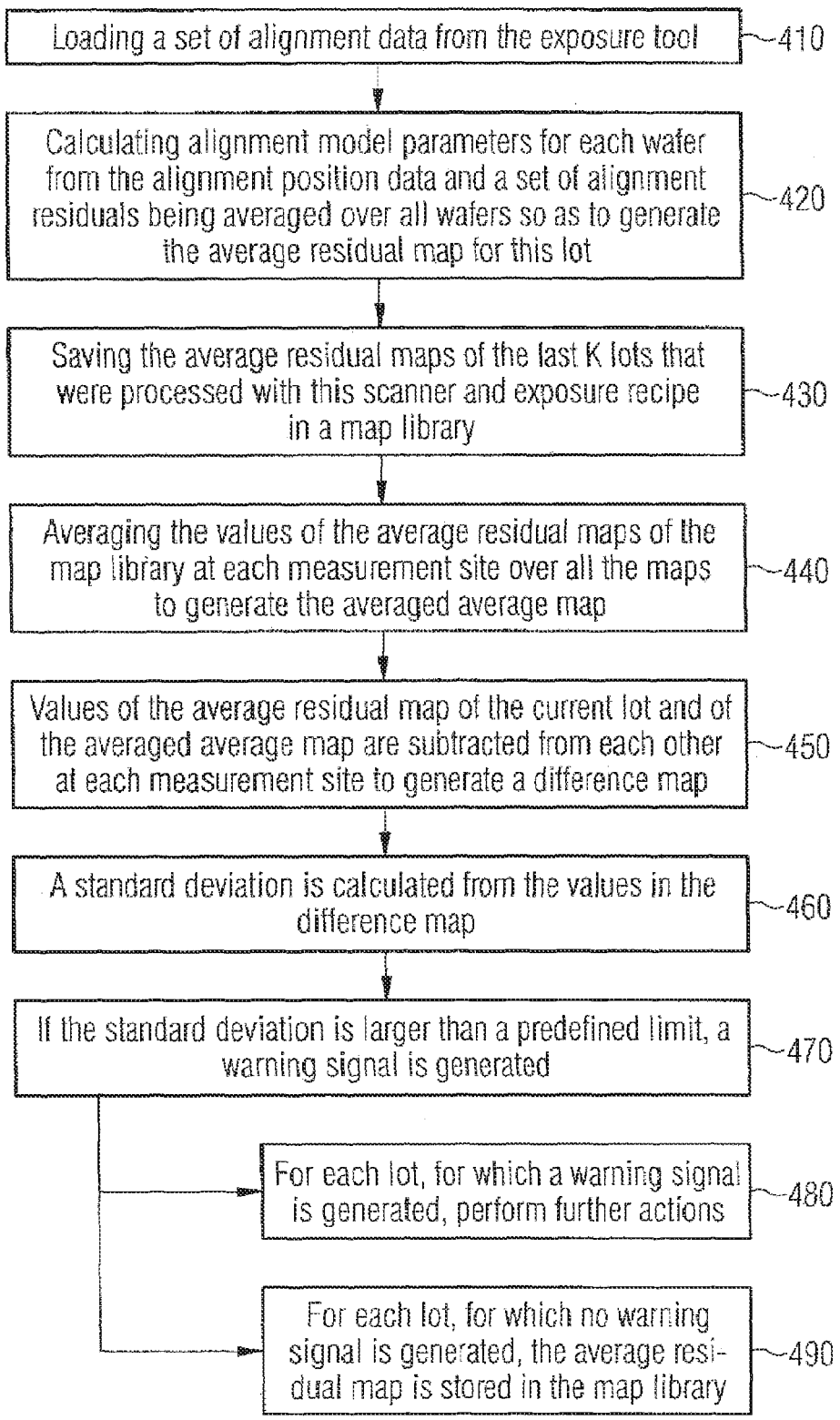

ALIGNMENT CALCULATION

TECHNICAL FIELD

Embodiments of the invention relate to methods and systems of calculating alignment residuals and of calculating alignment residuals based on several processed semiconductor wafers in a fabrication unit. Furthermore, embodiments of the invention relate to a computer readable medium.

BACKGROUND

In overlay critical lithography steps, non-linear wafer deformation is one possible source of non-uniformity. As the overlay budgets shrink with shrinking ground rules, and the processes get more aggressive, e.g., high aspect ratio etching or deposition of exotic materials, across wafer non-uniformity of several process steps result in non-uniform stress being applied to the wafer. This results in non-linear wafer deformation.

This can be partly corrected by non-linear alignment models, but this is often found insufficient mainly at the wafer edge. In addition, full wafer overlay measurements can be done to establish an overlay grid map that can be sent to the exposure tool in a feed-back loop.

With the ever increasing need for smaller and denser structures on a semiconductor wafer, the allowable positioning difference between, e.g., an actual processed resist film and a previously formed layer decreases as well. The tolerable overlay budget can influence the throughput through a fabrication unit, as semiconductor wafers which are outside the specification of the tolerable mismatch have to be reworked or otherwise sorted out.

Overlay accuracy depends, among other factors, upon the alignment of the semiconductor wafer with an exposure tool. Usually a mask projection step in an exposure tool is performed in different exposure fields which are arranged next to each other on the semiconductor wafer. Prior to exposure, the wafer is aligned to the projection mask of the exposure tool by use of an alignment system in the exposure tool.

In order to judge overlay stability, several semiconductor wafers are measured by an overlay metrology tool. The result is used for determining the actual overlay accuracy with respect to the processed wafer.

For these and other reasons, there is a need in the art to improve on alignment calculation.

SUMMARY OF THE INVENTION

A method of calculating alignment residuals in a fabrication unit is provided, comprising providing an alignment model including alignment model parameters; providing an exposure tool suitable for exposing a lot of semiconductor wafers in a plurality of exposure fields; retrieving alignment data comprising alignment values, measured by the exposure tool on respective semiconductor wafers of the lot at a plurality of positions of the exposure fields that are used to calculate values for the alignment model parameters of the alignment model; calculating a set of alignment residuals from the alignment data by subtracting effects of the alignment model parameters for each of the plurality of measured positions and for each of the semiconductor wafer in the lot; and issuing a warning signal based upon a comparison between the set of alignment residuals and a set of reference values.

A method of calculating alignment residuals in a fabrication unit is provided, comprising providing an alignment model including alignment model parameters; providing an exposure tool suitable for exposing at least a first set and a second set of semiconductor wafers at a plurality of exposure fields, the first set comprising at least one lot of semiconductor wafers that were exposed at an earlier point in time than the second lot; retrieving alignment data comprising alignment values measured by the exposure tool on respective semiconductor wafers of each of the lot at a plurality of positions of the exposure fields that are used to calculate values for the alignment model parameters of the alignment mode; calculating a set of alignment residuals from the alignment data by subtracting effects of the alignment model parameters for each of the plurality of measured positions and for each of the semiconductor wafer in the lots; and issuing a warning signal based upon a comparison between the set of alignment residuals and a set of reference values.

A system of calculating alignment residuals in a fabrication unit is provided, including: an exposure tool suitable for exposing a lot of semiconductor wafers in a plurality of exposure fields; and a processing unit storing an alignment model including alignment model parameters and suitable for retrieving alignment data comprising alignment values, measured by the exposure tool on respective semiconductor wafers of the lot at a plurality of positions of the exposure fields that are used to calculate values for the alignment model parameters of the alignment model, suitable of calculating a set of alignment residuals from the alignment data by subtracting effects of the alignment model parameters for each of the plurality of measured positions and for each of the semiconductor wafer in the lot, and suitable for issuing a warning signal based upon a comparison between the set of alignment residuals and a set of reference values.

A system of calculating alignment residuals in a fabrication unit is provided, including: means for providing an alignment model including alignment model parameters; means for providing an exposure tool suitable for exposing at least a first set and a second set of semiconductor wafers at a plurality of exposure fields, the first set comprising at least one lot of semiconductor wafers that were exposed at an earlier point in time than the second lot; means for retrieving alignment data comprising alignment values measured by the exposure tool on respective semiconductor wafers of each of the lot at a plurality of positions of the exposure fields that are used to calculate values for the alignment model parameters of the alignment mode; means for calculating a set of alignment residuals from the alignment data by subtracting effects of the alignment model parameters for each of the plurality of measured positions and for each of the semiconductor wafer in the lots; and means for issuing a warning signal based upon a comparison between the set of alignment residuals and a set of reference values.

A computer readable medium is provided including instructions capable of performing the following steps on a computer: providing an alignment model including alignment model parameters; reading input data including expected and measured alignment position values from an exposure tool suitable for exposing at least a first set and a second set of semiconductor wafers at a plurality of exposure fields, the first set comprising at least one lot of semiconductor wafers that were exposed at an earlier point in time than the second lot; retrieving alignment data comprising alignment values measured by the exposure tool on respective semiconductor wafers of each of the lot at a plurality of positions of the exposure fields that are used to calculate values for the alignment model parameters of the alignment mode; calculating a set of alignment residuals from the alignment data by subtracting effects of the alignment model parameters for each of the plurality of measured positions and for each of the semiconductor wafer in the lots; and issuing a warning signal based upon a comparison between the set of alignment residuals and a set of reference values.

BRIEF DESCRIPTION OF THE DRAWINGS

FIG. 4 schematically illustrates a process flow with a semiconductor wafer according to an embodiment.

DETAILED DESCRIPTION OF ILLUSTRATIVE EMBODIMENTS

Embodiments and/or implementations of methods and systems of calculating alignment residuals in a fabrication unit are discussed in detail below. It should be appreciated, however, that the present invention provides many applicable inventive concepts that can be embodied in a wide variety of specific contexts. The specific embodiments and/or implementations discussed below are merely illustrative of specific ways and do not limit the scope of the invention.

In the following, embodiments and/or implementations of the method and the system are described with respect to determining alignment stability during manufacturing of an integrated circuit. The embodiments, however, might also be useful in other respects, e.g., improvements in process control, improvements in identifying lot to lot variations of a layout pattern, yield enhancement techniques or the like.

Furthermore, it should be noted that the embodiments and/or implementations are described with respect to semiconductor wafers but might also be useful in other respects including but not limited to thin film elements. Other products, e.g., liquid crystal panels, solar cells, or the like might be produced as well.

Figure 1:
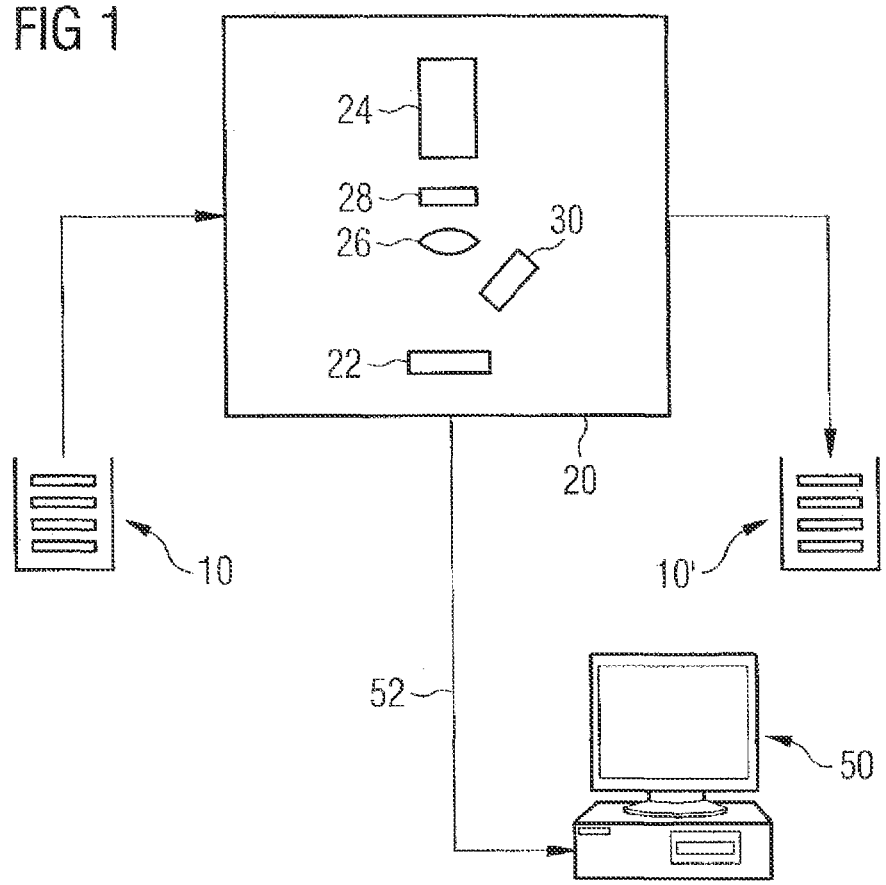
FIG. 1 schematically illustrates a system for alignment calculation according to an embodiment.

An implementation is now described making reference to FIG. 1.

FIG. 1 shows a system for performing alignment calculation in a schematic view. A plurality of wafers 10, usually referred to as a lot, is loaded into a fabrication unit having an exposure tool 20. The fabrication unit can include further tools required for processing semiconductor wafers.

The exposure tool includes a port for loading and unloading semiconductor wafers. Within the exposure tool 20 semiconductor wafers are placed on a substrate holder 22 and sequentially aligned. Afterwards the semiconductor wafers 10 are sequentially exposed with the desired pattern onto a resist film layer by using a light source 24 and a projection optic 26. The desired pattern can be stored on a photo mask 28, for example.

After the mask projection step, semiconductor wafers 10 are forwarded via unload port as processed semiconductor wafers 10' to an overlay measurement tool, for example. The overlay measurement tool (not shown in FIG. 1) can be an integral part of fabrication unit, although other configurations are conceivable as well. Furthermore, for the sake of simplicity, intermediate process steps which might be required, such as post-exposure bake, development processes and the like, are not discussed.

Figure 2:
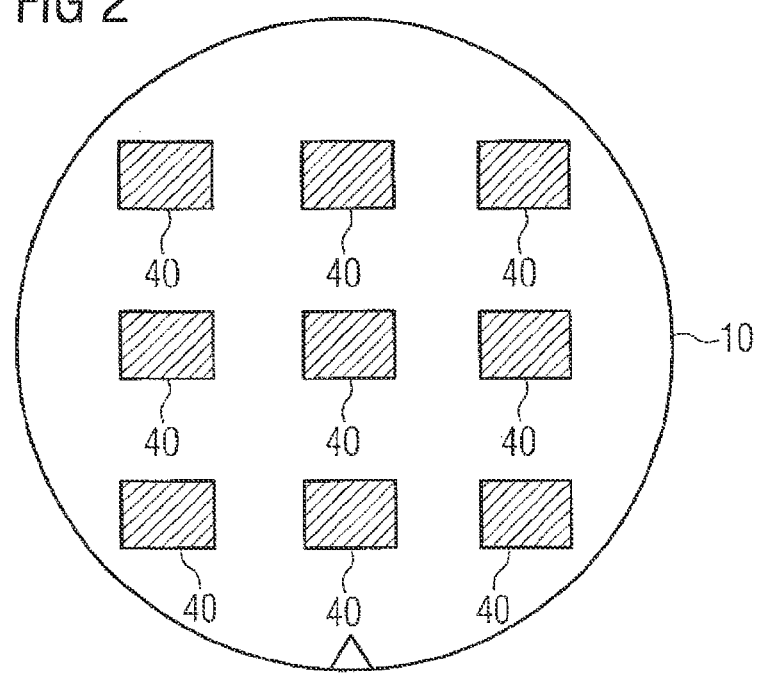
FIG. 2 schematically illustrates a semiconductor wafer in a top view according to an embodiment.

The alignment procedure is usually performed on alignment marks from a sub sample of exposure fields, as schematically shown in FIG. 2. FIG. 2 shows semiconductor wafer 10 and sub sample of several exposure fields 40 which are used during alignment. Within an individual exposure field 40 several different types of marks can be arranged at various positions.

The actual alignment is measured by an alignment system 30, which optically inspects alignment marks, as schematically indicated in FIG. 1. The detected signals are further processed and the aligned position is recorded. With the total of aligned positions which are measured on the semiconductor wafer, alignment correction model parameters are calculated using a certain alignment strategy, which can include, for example, employing optical measurements with different wavelengths, applying different optical filters between the semiconductor wafer and the alignment tool or by using different mathematical models in order to extract the alignment values from the recorded signals. With the calculated alignment correction model parameters, a series of corrections are calculated per exposure field.

A processing unit 50, which can be a computer or the like, receives measured data from the exposure tool 20 via a data connection 52. Before the exposure, the wafer is loaded to the exposure chuck, and the litho tool performs the alignment measurement, on so-called alignment marks, to find out where the wafer is located exactly. The alignment compares the measured positions to a nominal calibrated grid, and calculates a corrected grid, using a certain alignment model.

If non-linear alignment is used, usually, a large number of alignment marks are measured on each wafer, giving a good representation of the actual wafer grid. On top of the corrected grid, the grid correction resulting from the feed-back map is added. This map is a prediction of the correction that the alignment system could not perform.

For most lithography tools, the raw alignment positions can be stored for every measured position. If a model is calculated from these raw data, and the effects of these model parameters are subtracted from the measured positions, so-called alignment residuals of that model can be obtained. The alignment residuals of a linear, e.g., a six parameter model can be used as a measure of the non-linear deformation of that wafer.

It should be noted however that full wafer overlay measurements are very slow, so they cause a tool capacity problem. Even if only a subset of wafers is measured, this will limit production capacity in an unacceptable way.

Furthermore, when only a sub-set of wafers or not every lot is measured, there is no possibility to detect all wafers, which are deviating in an exceptional way, something which is more likely to occur in effects introduced by process non-uniformity, than by the usual process deviations. If, by accident, the measured wafers are the deviating ones, this may even have serious consequences for the feedback stability. This is due to the fact, that the extensive, full wafer overlay measurements, cannot be done on each wafer.

According to embodiments, these alignment residuals are used for an in-line comparison of wafers/lots to each other, and determine, whether there are wafers with deviating non-linear deformation signatures. If a wafer or lot has a deviating non-linear deformation from the measurements on which its feed-back map was based, a warning can be generated, that the wafer is unusual. Resulting automated actions can involve a full wafer measurement on a particular wafer, or exclusion of a wafer/lot so that it is not used to update the feed-back loop.

Figure 3:
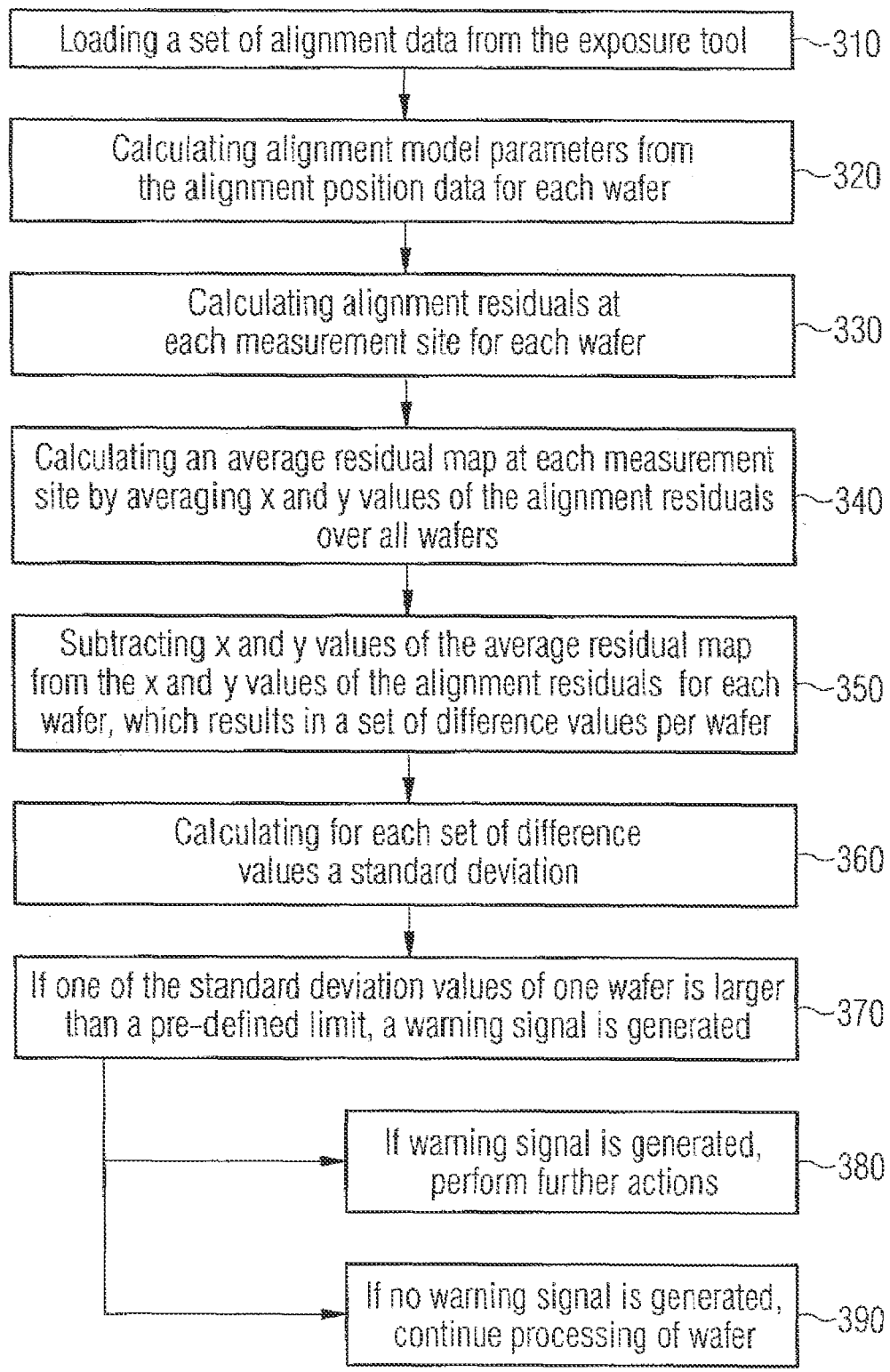
FIG. 3 schematically illustrates a process flow with a semiconductor wafer according to an embodiment.

In FIG. 3, a flow diagram of method steps is shown that compares alignment residuals of different wafers within the lot.

Accordingly, it can be judged whether there are wafers with a deviating non-linear signature. Furthermore, a comparison of the average alignment residuals, i.e., average of all wafers of a lot, to the average of averages of a number of previous lots can be performed.

After a lot is exposed, a set of alignment data is downloaded from the exposure tool as shown as step 310. This set of alignment position data can include for each semiconductor wafer 10 and for each measurement site a value corresponding to expected positions and a value corresponding to measured positions. Both values are usually described in two dimensions, i.e., in x- and y-coordinates, when using a Cartesian coordinate system. Other descriptions of a coordinate system are not excluded.

Per wafer, a six parameter model is calculated from the alignment position data, i.e., from the expected positions and the measured positions, as schematically indicated by step 320 in FIG. 3.

At each measurement site, the effect of the six parameter model is subtracted from the difference between the measured positions and the expected positions. These are the alignment residuals. This is done separately for each semiconductor wafer in step 330.

At each measurement site, the x and y values of the alignment residuals are averaged over all of the semiconductor wafers 10. This is the average residual map, as schematically indicated by step 340 in FIG. 3. At each measurement site, the x and y values of the average residual map are subtracted from the x and y values of the alignment residuals. This is done for each semiconductor wafer 10, resulting in a set of difference values per semiconductor wafer 10 in step 350.

For each set of difference values, a standard deviation is calculated. As a result, for each semiconductor wafer 10, a first standard deviation value is available in x-direction, and a second standard deviation value is available in y-direction in step 360.

If one of the standard deviation values of one semiconductor wafer is larger than a pre-defined limit, a warning signal is generated in step 370.

For each semiconductor wafer, for which a warning signal is generated, possible actions can include in step 380, performing extra overlay measurement on this semiconductor wafer or reworking the semiconductor wafer with a different grid correction/alignment setting.

In step 390, the semiconductor wafer, which has not triggered a warning signal, is passed to further fabrication units.

In FIG. 4, a flow diagram of method steps is shown that compares alignment residuals of different lots which include a plurality of semiconductor wafers within the lot.

Processing begins at step 410 in FIG. 4. After a lot is exposed, a set of alignment data is downloaded from the exposure tool 20, e.g., via connection 52 on processing unit 50, as shown in FIG. 1. The set of alignment data includes per semiconductor wafer and at each measurement site, values corresponding to expected positions and measured positions. Both values are usually described in two dimensions, i.e., in x- and y-coordinates, as described above.

Per semiconductor wafer, a six parameter model is calculated from the alignment position data, and a set of alignment residuals is calculated. The alignment residuals are averaged over all semiconductor wafers to generate the average residual map for this lot in step 420.

The average residual maps of the last lots that were processed with this exposure tool 20, e.g., a scanner, and with a certain exposure recipe are saved at step 430 in a map library which can be stored on processing unit 50. For example, the number of lots being stored can be set to a predefined value.

The values both in x- and y-direction of the average residual maps of the map library are averaged at each measurement site over all the maps, to generate the averaged average map in step 440.

The values both in x- and y-direction of the average residual map of the current lot and of the averaged average map are subtracted from each other at each measurement site to generate a difference map in step 450.

A standard deviation is calculated from the values of both in x- and y-direction in the difference map in step 460.

If the value in x- or y-direction of the standard deviation is larger than a predefined limit, a warning signal is generated in step 470.

For each lot, for which a warning signal is generated, possible actions include in step 480:
Perform extra overlay measurement on this lot,
Re-work lot with a different grid correction/alignment setting,
Do not use the lot to update the average map in the map library, or
Do not use the overlay data of the lot to update the grid correction database.

For each lot, for which no warning signal is generated, the average residual map is stored in the map library in step 490.

In summary, the following steps can be performed: automatic judgment if wafers are exceptional or not, and whether lots are deviating, automatic generation of a warning that action should be taken. Further automatic actions can include: full wafer overlay measurements, usage or not of full wafer overlay measurements in the run to run controller, applying a limit for the wafer-to-wafer comparison or a limit for comparison of the lot-average map to previous lots. Number of previous lots to be used for the lot comparison can also be adjusted.

In both implementations which have been described with respect to FIG. 3 and FIG. 4, further processing steps can be implemented. For example, a smoothing procedure can be applied after generating the average residual map for each wafer or lot of wafers. The smoothing procedure can be controlled by specific settings including parameters like use smoothing at all, the smoothing grid distance, weighting mechanism selection or weighting settings.

Having described embodiments of the invention, it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and the particularity required by the patent laws, what is claimed and desired to be protected by Letters Patent is set forth in the appended claims.

What is claimed is:

1. A method of calculating alignment residuals in a fabrication unit, the method comprising:
providing an alignment model including alignment model parameters;
providing an exposure tool suitable for exposing a lot of semiconductor wafers in a plurality of exposure fields;
retrieving alignment data comprising alignment values measured by the exposure tool on respective semiconductor wafers of the lot at a plurality of positions of the exposure fields that are used to calculate values for the alignment model parameters of the alignment model;
calculating a set of alignment residuals from the alignment data by subtracting effects of the alignment model parameters for each of a plurality of measured positions and for each of the semiconductor wafers in the lot;

issuing a warning signal based upon a comparison between the set of alignment residuals and a set of reference values, wherein the set of reference values are calculated by averaging the alignment residuals over each semiconductor wafer of the lot at each of the plurality of positions;

subtracting the reference values from the alignment residuals for each of the semiconductor wafers of the lot and at each of the plurality of positions, so as to calculate a resulting set of difference data for each semiconductor wafer of the lot; and calculating a standard deviation from the resulting set of difference data for each of the semiconductor wafer of the lot.

2. The method according to claim 1, wherein the standard deviation is compared to a pre-defined limit, in order to generate a waiting signal.

3. The method according to claim 2, wherein issuing the warning signal comprises performing additional overlay measurements on the semiconductor wafers, for which the warning signal was triggered.

4. The method according to claim 2, wherein issuing the warning signal comprises re-working the semiconductor wafers, for which the warning signal was triggered.

5. The method according to claim 2, wherein issuing the warning signal comprises re-working the semiconductor wafers, for which the warning signal was triggered, and exposing them with an alternative alignment recipe or an alternative set of grid correction parameters.

6. A method of calculating alignment residuals in a fabrication unit, the method comprising:

providing an alignment model including alignment model parameters;

providing an exposure tool suitable for exposing at least a first set and a second set of semiconductor wafers at a plurality of exposure fields, the first set comprising at least one lot of semiconductor wafers that were exposed at an earlier point in time than a second lot of semiconductor wafers;

retrieving alignment data comprising alignment values measured by the exposure tool on respective semiconductor wafers of each of the lots at a plurality of positions of the exposure fields that are used to calculate values for the alignment model parameters of the alignment model;

calculating a set of alignment residuals from the alignment data by subtracting effects of the alignment model parameters for each of a plurality of measured positions and for each of the semiconductor wafer in the lots;

issuing a warning signal based upon a comparison between the set of alignment residuals and a set of reference values, wherein the set of reference values are calculated by averaging the alignment residuals of the first plurality of semiconductor wafers at each of the plurality of measured positions calculating a second set of average alignment residuals a by averaging the alignment residuals of the second lot of semiconductor wafers at each of the plurality of positions subtracting the set of the average alignment residuals of the second lot of semiconductor wafers from the reference values at each of the plurality of positions, so as to determine a set of difference data; and calculating a standard deviation from the resulting set of difference data for the second lot of semiconductor wafers.

7. The method according to claim 6, wherein the standard deviation is compared to a pre-defined limit, in order to generate a warning signal.

8. The method according to claim 6, wherein issuing a warning signal comprises performing additional overlay measurements on the semiconductor wafers of the lot, for which the warning signal was triggered.

9. The method according to claim 6, wherein issuing a warning signal comprises re-working the semiconductor wafers of the lot, for which the warning signal was triggered.

10. The method according to claim 6, wherein issuing a warning signal comprises performing additional overlay measurements on the semiconductor wafers of the lot, for which the warning signal was triggered and exposing them with an alternative alignment recipe or an alternative set of grid correction parameters.

11. The method according to claim 6, wherein issuing a warning signal comprises excluding measured overlay data from the lot, for which the waning signal was triggered from being used to update grid correction parameters for lots of semiconductor wafers that will be exposed at a later point in time.

12. A system of calculating alignment residuals in a fabrication unit, the system comprising:

an exposure tool suitable for exposing a lot of semiconductor wafers in a plurality of exposure fields; and a processing unit storing an alignment model including alignment model parameters and suitable of retrieving alignment data comprising alignment values measured by the exposure tool on respective semiconductor wafers of the lot at a plurality of positions of the exposure fields that are used to calculate values for the alignment model parameters of the alignment model, suitable of calculating a set of alignment residuals from the alignment data by subtracting effects of the alignment model parameters for each of a plurality of measured positions and for each of the semiconductor wafer in the lot, suitable for issuing a warning signal based upon a comparison between the set of alignment residuals and a set of reference values, wherein the set of reference values are calculated by averaging the alignment residuals over each semiconductor wafer of the lot at each of the plurality of positions, suitable for subtracting the reference values from the alignment residuals for each of the semiconductor wafers of the lot and at each of the plurality of positions, so as to calculate a resulting set of difference data for each semiconductor wafer of the lot, and suitable for calculating a standard deviation from the resulting set of difference data for each of the semiconductor wafer of the lot.

13. A system of calculating alignment residuals in a fabrication unit, including:

means for providing an alignment model including alignment model parameters;

an exposure tool suitable for exposing at least a first set and a second set of semiconductor wafers at a plurality of exposure fields, the first set comprising at least one lot of semiconductor wafers that were exposed at an earlier point in time than a second lot of semiconductor wafers;

means for retrieving alignment data comprising alignment values measured by the exposure tool on respective semiconductor wafers of each of the lots at a plurality of positions of the exposure fields that are used to calculate values for the alignment model parameters of the alignment model;

means for calculating a set of alignment residuals from the alignment data by subtracting effects of the alignment model parameters for each of a plurality of measured positions and for each of the semiconductor wafer in the lots; and means for issuing a warning signal based upon a comparison between the set of alignment residuals and a set of reference values, wherein the set of reference values are calculated by averaging the alignment residuals over each semiconductor wafer of the lot at each of the plurality of positions;

means for subtracting the reference values from the alignment residuals for each of the semiconductor wafers of the lot and at each of the plurality of positions, so as to calculate a resulting set of difference data for each semiconductor wafer of the lot; and means for calculating a standard deviation from the resulting set of difference data for each of the semiconductor wafer of the lot.

14. A non-transient computer readable medium, the computer readable medium including instructions capable of performing the following steps on a computer:

providing an alignment model including alignment model parameters;

reading input data including expected and measured alignment position values from an exposure tool suitable for exposing at least a first set and a second set of semiconductor wafers at a plurality of exposure fields, the first set comprising at least one lot of semiconductor wafers that were exposed at an earlier point in time than a second lot of semiconductor wafers;

retrieving alignment data comprising alignment values measured by the exposure tool on respective semiconductor wafers of each of the lot at a plurality of positions of the exposure fields that are used to calculate values for the alignment model parameters of the alignment model;

calculating a set of alignment residuals from the alignment data by subtracting effects of the alignment model parameters for each of a plurality of measured positions and for each of the semiconductor wafer in the lots; and issuing a warning signal based upon a comparison between the set of alignment residuals and a set of reference values, wherein the set of reference values are calculated by averaging the alignment residuals over each semiconductor wafer of the lot at each of the plurality of positions;

subtracting the reference values from the alignment residuals for each of the semiconductor wafers of the lot and at each of the plurality of positions, so as to calculate a resulting set of difference data for each semiconductor wafer of the lot; and calculating a standard deviation from the resulting set of difference data for each of the semiconductor wafer of the lot.

15. The computer readable medium according to claim 14, further comprising instructions capable of performing extra overlay measurement on this semiconductor wafer or triggering to rework the semiconductor wafer with a different grid correction/alignment setting.

\* \* \* \* \*